United States Patent [19]
Balmer et al.

[11] Patent Number: 5,548,121
[45] Date of Patent: Aug. 20, 1996

[54] ELECTRONICALLY SHIELDED SOLID STATE CHARGED PARTICLE DETECTOR

[76] Inventors: David K. Balmer, 155 Coral Way, Broomfield, Colo. 80020; Thomas W. Haverty, 1173 Logan, Northglenn, Colo. 80233; Carl W. Nordin, 7203 W. 32nd Ave., Wheatridge, Colo. 80033; William H. Tyree, 1977 Senda Rocosa, Boulder, Colo. 80303

[21] Appl. No.: 496,843

[22] Filed: Jun. 27, 1995

[51] Int. Cl.$^6$ .............................. G01T 1/24; H01J 37/04
[52] U.S. Cl. ....................... 250/370.01; 250/397
[58] Field of Search ..................... 250/370.01, 370.02, 250/397, 492.21

[56] References Cited

U.S. PATENT DOCUMENTS

| 3,668,400 | 6/1972 | Kozlov .............................. 250/370.01 |
| 5,065,028 | 11/1991 | Cranston et al. ................... 250/370.01 |

Primary Examiner—Davis L. Willis
Assistant Examiner—Kiet T. Nguyen
Attorney, Agent, or Firm—Luis M. Ortiz; James H. Chafin; William R. Moser

[57] ABSTRACT

An electronically shielded solid state charged particle detector system having enhanced radio frequency interference immunity includes a detector housing with a detector entrance opening for receiving the charged particles. A charged particle detector having an active surface is disposed within the housing. The active surface faces toward the detector entrance opening for providing electrical signals representative of the received charged particles when the received charged particles are applied to the active surface. A conductive layer is disposed upon the active surface. In a preferred embodiment, a nonconductive layer is disposed between the conductive layer and the active surface. The conductive layer is electrically coupled to the detector housing to provide a substantially continuous conductive electrical shield surrounding the active surface. The inner surface of the detector housing is supplemented with a radio frequency absorbing material such as ferrite.

20 Claims, 1 Drawing Sheet

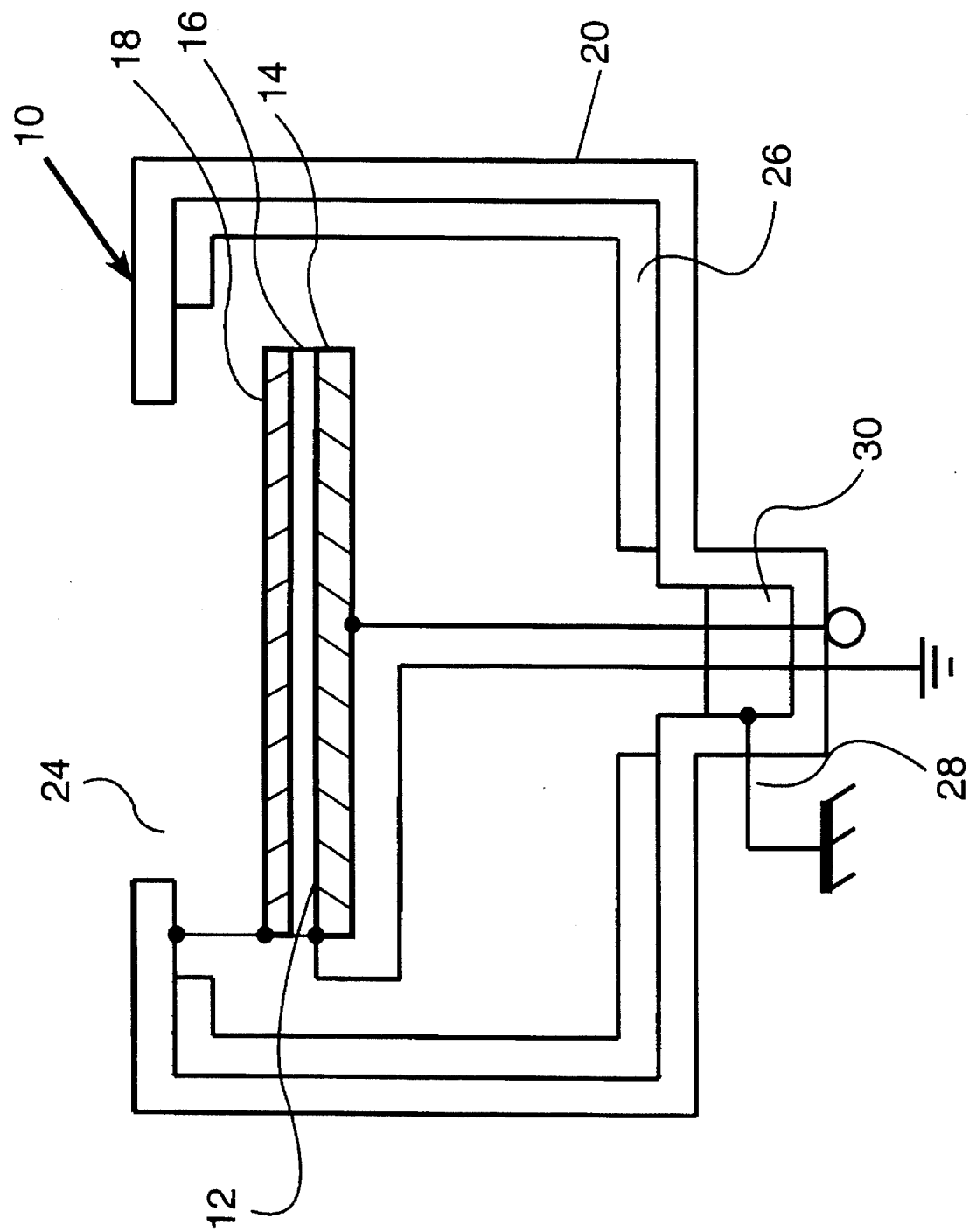

ELECTRONICALLY SHIELDED SOLID STATE CHARGED PARTICLE DETECTOR

The U.S. Government has rights to this invention pursuant to Contract Number DE-AC04-90DP62349 between the United States Department of Energy and EG&G Rocky Flats, Inc.

FIELD OF THE INVENTION

The present invention relates generally to charged particle detectors and, in particular, to charged particle detectors having shielding for enhanced immunity to radio frequency interference.

BACKGROUND OF THE INVENTION

Prior solid state charged particle detectors, used in transuranic aerosol monitor designs, are provided with annular or open-flamed inlets through their detector housings which serve as entrance windows in order to permit charged particles to have access to the active surfaces of the detectors and to improve sample collection efficiency. However, charged particle detectors having such entrance windows are sometimes subject to unacceptable susceptibility to radio frequency interference and other electronic noise due to leakage of spurious energy into the detector housings through the entrance windows.

Metalized film barriers may be used to provide shielding over the detector entrance windows in order to provide enhanced protection against the electronic noise. However, charged particle detectors having this method of enhanced protection are of limited application because of the associated loss of resolution of detected charged particle energies resulting from the layer of metalized film shielding. Typically, the loss of resolution is sufficient to make the distinction between transuranic isotopes and the naturally occurring radon decay products difficult to determine at the lower particle concentrations of interest.

For example, prior art charged particle detectors are typically used to detect a range of alpha particle energies from 4.2 to 5.2 Mev resulting from the original decay energies of 5.2 to about 5.5 Mev from transuranics. If alpha particles must pass through a metalized film layer, in addition to an air gap, the range of alpha particle energies striking the active surface of the detector will be considerably broader. With increased degradation of alpha particle energies, many of those originating at typically 6 and 7.68 Mev from the naturally occurring decay products of Radon will be indistinguishable at the detector surface from those originating from transuranic elements.

Another problem with the prior art is the occurrence of ground loops in the detector housings. Such ground loops result from the high frequency skin effect currents through the detector housings caused by electromagnetic radiation, typically associated with communication signals and electrical equipment operation, and the resistance inherent in the detector housings. Current in ground loops created in this manner may cause spurious signals within the detector circuitry similar in amplitude to alpha particle interaction signals and cause inaccurate detection results.

The present invention includes a thin conductive coating of approximately one thousand angstroms over a silicon solid state detector which has a polymer insulating layer to provide resistance to abrasion and chemical corrosion. The conductive coating provides an isolated shielding layer with a minimum loss in detector charged particle energy resolution. The use of beryllium for the conductive shielding layer is preferred over other metal coatings such as aluminum or gold. A metallic detector support structure is electrically connected to the conductive coating in order to provide a continuous electronic shield. The inner surface of the detector support structure is lined with a radio frequency absorbing material such as ferrite in order to minimize conductive and reflective effects in the support structure in the vicinity of the active surface of the detector. The internal frequency absorbing lining allows the exterior of the assembly to be a smooth, cleanable surface suitable for aerosol monitoring or related applications.

SUMMARY OF THE INVENTION

Briefly stated, the present invention comprises an electronically shielded solid state charged particle detector system having enhanced radio frequency interference immunity including a detector housing with a detector entrance window for receiving the charged particles. A charged particle detector having an active surface is disposed within the housing. The active surface of the charged particle detector faces the detector entrance window for providing electrical signals representative of the received charged particles when the received charged particles are applied to the active surface. A conductive layer is disposed upon the active surface. The conductive layer is electronically coupled to the housing to provide a substantially continuous conductive electrical shield surrounding the active surface.

BRIEF DESCRIPTION OF THE DRAWINGS

The foregoing summary, as well as the following detailed description of preferred embodiments of the invention, will be better understood when read in conjunction with the appended drawing. For the purpose of illustrating the invention, there is shown in the drawing an embodiment which is presently preferred. It should be understood, however, that the invention is not limited to the precise arrangements and instrumentalities shown.

The drawing is a schematic representation of the electronically shielded solid state charged particle detector system in accordance with a preferred embodiment of the present invention.

DETAILED DESCRIPTION OF PREFERRED EMBODIMENTS

Referring to the drawing there is shown a schematic representation of a preferred embodiment of an electronically shielded solid state charged particle detector system 10 in accordance with the present invention. The electronically shielded solid state charged particle detector system 10 includes a solid state charged particle detector 14 having an active surface 12 for detecting charged particles and providing electrical signals representative of the charged particles when the charged particles are applied to the active surface 12. The charged particle detector 14 is disposed within a conductive detector housing 20 having an entrance opening or window 24 for permitting the charged particles to pass therethrough into the interior of the detector housing 20 so that the charged particles may strike the active surface 12 of the particle detector 14. In the preferred embodiment of the charged particle detector system 10 the active surface 12 of the particle detector 14 is adapted to detect alpha particles. However, it will be understood that the active surface 12 may also be adapted to detect beta particles or other types of charged particles in accordance with the present invention.

A nonconductive coating 16 is disposed upon the active surface 12 of the solid state charged particle detector 14 in order to provide improved resistance to abrasion and chemical erosion for the active surface 12 of the charged particle detector 14. The nonconductive coating 16 may be formed of a polymer such as polyurethane. A thin conductive layer 18 is disposed upon the nonconductive coating 16 in order to provide enhanced radio frequency interference immunity to the operation of the charged particle detector 14. The conductive layer 18 may be a metallic layer preferably formed of beryllium and preferably has a thickness of approximately one-thousand angstroms. Beryllium is preferred because it is hard and low density as well as having the required electrical characteristics. The method for depositing the conductive layer 18 may be a conventional vacuum vapor deposition process wherein a hard vacuum is drawn and the beryllium is heated to cause it to vaporize and condense upon the nonconductive coating 16. Other known methods may be used to create the conductive layer 18 and other conductive elements may be employed.

The conductive layer 18 is preferably electrically coupled by a wire or other means to the conductive detector housing 20 and the conductive detector housing 20 is electrically coupled to a chassis ground 28. The conductive detector housing 20 is preferably formed of a metal. Thus the conductive layer 18, the metallic housing 20 and the chassis ground 28 are maintained at the same electrical potential. Radio frequency electromagnetic radiation striking the conductive coating 18 is conducted away from the active surface 12 of the solid state detector 14 to the chassis ground 28 by way of the metallic detector housing 20.

Because of the high frequency of interfering electromagnetic radiation potentially exposing the detector system 10 there may still be some current flow back and forth in the skin of the detector housing 20 as current is conducted to the chassis ground 28 in spite of the absence of average electrical potential. This oscillating current flow could give rise to electronic pulses similar to those caused by alpha particles leading: to inaccurate results from the detector system 10, particularly if the radiation arises in the vicinity of the active surface 12 of the charged particle detector 14. Therefore a radio frequency interference absorbing coating 26 is provided upon the inner surface of the detector housing 20. Ferrite is preferably used to form the absorbing coating 26 but other radio frequency absorbing material may be used. The ferrite is preferably applied as a commercially available coating compound known to those skilled in the art which may be painted onto the inner surface of the detector housing 20. Alternately, ferrite may be mechanically attached to the inner surface of the detector housing 20 or applied in some other manner. The absorbing coating 26 dissipates the varying potential within the detector housing 20 caused by electromagnetic radiation which may otherwise induce signals across the charged particle detector 14.

If the thickness of the conductive layer 18 is approximately one-thousand angstroms, charged particles detected by the charged particle detector system 10 strike the conductive layer 18 and pass through the conductive layer 18 to the insulating coating 16 and, therethrough, to the active surface 12 of the charged particle detector 14 with a minimal energy loss. If the conductive layer 18 is too thin, the conductive layer 18 does not provide enough of a path to ground for conducting the currents induced when radio frequency noise signals strike the conductive coating 18. Under these circumstances the conductive coating 18 does not provide substantially enhanced immunity to radio frequency interference.

If the conductive layer 18 is too thick the energy level of the charged particles passing therethrough is too attenuated to provide good detection by the charged particle detection system 10. The minimal energy loss resulting from a thickness of one-thousand angstroms provides sufficient energy resolution for mono-energetic alpha particle sources and the ability to distinguish between various radioactive isotopes in hostile radio frequency environments.

A connector 30 is provided for external connection to the particle detection system 10. The connector 30 may be a two-conductor coaxial connector with an isolated ground for cases where the detector housing 20 is directly connected to a metal amplification electronics enclosure (not shown) with an internal signal cable. A twin axial or tri-axial type of connector with two conductors having an outer shield may be preferred for cases where the particle detection system 10 must be separated a short distance from electronic amplification circuitry.

The charged particle detector 14 within the charged particle, detection system 10 may conveniently be a conventional device such as a surface barrier detection device. Diffused junction detection devices, also well known to those skilled in the art, may also be used. The diffused junction detection devices are somewhat more rugged than the surface barrier devices but are not believed to provide detector resolutions which are as good as the resolution provided by the surface barrier devices. Additionally, ion implanted detection devices may be used to detect particles within the system 10.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An electronically shielded solid state charged particle detector system, comprising:

a) a conductive detector housing having a detector entrance window for receiving charged particles;

b) a charged particle detector having an active surface disposed within said conductive detector housing, said active surface facing said detector entrance window for providing electrical signals representative of said received charged particles when said received charged particles are applied to said active surface; and c) a conductive layer disposed upon said active surface and electrically coupled to said conductive detector housing to provide a substantially continuous conductive electrical shield surrounding said active surface.

2. The solid state charged particle detector system according to claim 1, wherein said conductive layer is a metallic conductive layer.

3. The solid state charged particle detector system according to claim 2, further comprising a nonconductive layer disposed between said conductive layer and said active surface.

4. The solid state charged particle detector system according to claim 3, wherein said conductive detector housing is electrically coupled to a chassis ground.

5. The solid state charged particle detector system according to claim 3, wherein said conductive detector housing includes an inner surface which is lined with a radio frequency interference absorbing material.

6. The solid state charged particle detector system according to claim 5, wherein said radio frequency interference absorbing material is ferrite.

7. The solid state charged particle detector system according to claim 6, wherein said conductive layer has a thickness of approximately one-thousand angstroms.

8. The solid state charged particle detector system according to claim 7, wherein said conductive layer comprises beryllium.

9. The solid state charged particle detector system according to claim 5, wherein said radio frequency absorbing material is applied to said detector housing as a coating.

10. The solid state charged particle detector system according to claim 3, wherein said nonconductive layer is formed of a polymer.

11. The solid state charged particle detector system according to claim 10, wherein said polymer is polyurethane.

12. A method for detecting charged particles with enhanced radio frequency interference immunity, comprising the steps of:
 a) providing a conductive detector housing having a detector entrance window for receiving said charged particles;
 b) disposing a charged particle detector having an active surface within said conductive detector housing, said active surface facing said detector entrance window for providing electrical signals representative of said received charged particles when said received charged particles are applied to said active surface;
 c) disposing a radio frequency interference absorbing material on an inner surface of said conductive detector housing; and
 d) disposing a conductive layer upon said active surface.

13. The method for detecting charged particles according to claim 12, comprising the further step of disposing a nonconductive layer between said conductive layer and said active surface.

14. The method for detecting charged particles according to claim 12, comprising the further step of electrically coupling said conductive layer to said detector housing to provide a substantially continuous conductive electrical shield surrounding said active surface.

15. The method for detecting charged particles according to claim 14 wherein the step (c) comprises the step of coating said inner surface with a radio frequency absorbing compound.

16. The method for detecting charged particles according to claim 15, wherein said radio frequency absorbing material is ferrite.

17. The method for detecting charged particles according to claim 16, wherein said conductive layer comprises beryllium.

18. An electronically shielded solid state charged particle detector system having enhanced radio frequency interference immunity, comprising:
 a) a conductive detector housing having a detector entrance window for receiving charged particles;
 b) an inner surface within said housing comprising a radio frequency interference absorbing material;
 c) a charged particle detector having an active surface disposed within said conductive detector housing, said active surface facing said detector entrance window for providing electrical signals representative of said received charged particles when said received charged particles are applied to said active surface; and
 d) a conductive layer disposed upon said active surface and electrically coupled to said conductive detector housing to provide a substantially continuous conductive electrical shield surrounding said active surface.

19. The system of claim 18 further comprising a nonconductive layer disposed between said conductive layer and said active surface.

20. The system of claim 19 wherein said radio frequency absorbing material is ferrite, said nonconductive layer is polyurethane, and said conductive layer is beryllium.

* * * * *